United States Patent
Bohm et al.

(10) Patent No.: US 6,312,539 B1
(45) Date of Patent: Nov. 6, 2001

(54) METHOD OF USING TIRE TAG PROTECTOR

(75) Inventors: Georg G. A. Bohm, Akron; Russell W. Koch, Hartville, both of OH (US); Paul B. Wilson, Murfreesboro, TN (US); Robert J. Trew, Arlington, VA (US)

(73) Assignee: Bridgestone/Firestone Research, Inc., Akron, OH (US)

( * ) Notice: Subject to any disclaimer, the term of this patent is extended or adjusted under 35 U.S.C. 154(b) by 0 days.

(21) Appl. No.: 09/272,472

(22) Filed: Mar. 19, 1999

(51) Int. Cl.$^7$ .................... B29C 65/48; B29C 65/56; B60C 23/00; G01M 17/02

(52) U.S. Cl. .................... 156/64; 73/146; 152/152.1; 156/247; 156/292; 156/344

(58) Field of Search .................... 156/64, 247, 344, 156/110.1, 292; 152/152.1; 73/146

(56) References Cited

U.S. PATENT DOCUMENTS

| | | | |
|---|---|---|---|
| 3,782,177 | * 1/1974 | Hoop | 73/71.54 |
| 3,985,984 | 10/1976 | Cappa . | |
| 4,068,898 | * 1/1978 | Hanson | 40/616 |
| 4,382,830 | * 5/1983 | Cohn | 156/64 |
| 4,520,307 | * 5/1985 | Weiss et al. | 324/54 |
| 4,550,827 | 11/1985 | Watts et al. | 206/304 |
| 4,831,210 | 5/1989 | Larson et al. . | |
| 4,911,217 | 3/1990 | Dunn et al. | 152/152.1 |
| 5,254,201 | * 10/1993 | Konda et al. | 156/344 |
| 5,473,111 | 12/1995 | Hattori et al. . | |
| 5,562,787 | 10/1996 | Koch et al. | 156/64 |
| 5,573,610 | 11/1996 | Koch et al. | 152/152.1 |
| 5,573,611 | 11/1996 | Koch et al. | 152/152.1 |
| 5,704,117 | * 1/1998 | Mok et al. | 29/841 |
| 5,847,317 | 12/1998 | Phelps . | |
| 6,114,849 | * 9/2000 | Price et al. . | |

FOREIGN PATENT DOCUMENTS

| | | |
|---|---|---|
| 42 42 861 A1 | 6/1994 | (DE) . |
| 0 689 950 A2 | 1/1996 | (EP) . |

* cited by examiner

*Primary Examiner*—Steven D. Maki
(74) *Attorney, Agent, or Firm*—Thomas R. Kingsbury; Michael Sand; John H. Hornickel

(57) ABSTRACT

A tire tag protector is used to cover a tire tag on the inside of a pneumatic tire during a high-voltage, non-destructive test procedure. The tire tag protector includes a layer of dielectric and is configured to fit completely over the tire tag inside a pneumatic tire, the tire tag protector may also include a layer of conductive material. The tire tag protector is temporarily attached to the tire by an adhesive or by prongs that engage the tire tag. The tire tag protector prevents the high-voltage electrode used in the test procedure from snagging on the tire tag and prevents the sensitive electronic equipment of the tire tag from being damaged by the high-voltage test environment.

8 Claims, 4 Drawing Sheets

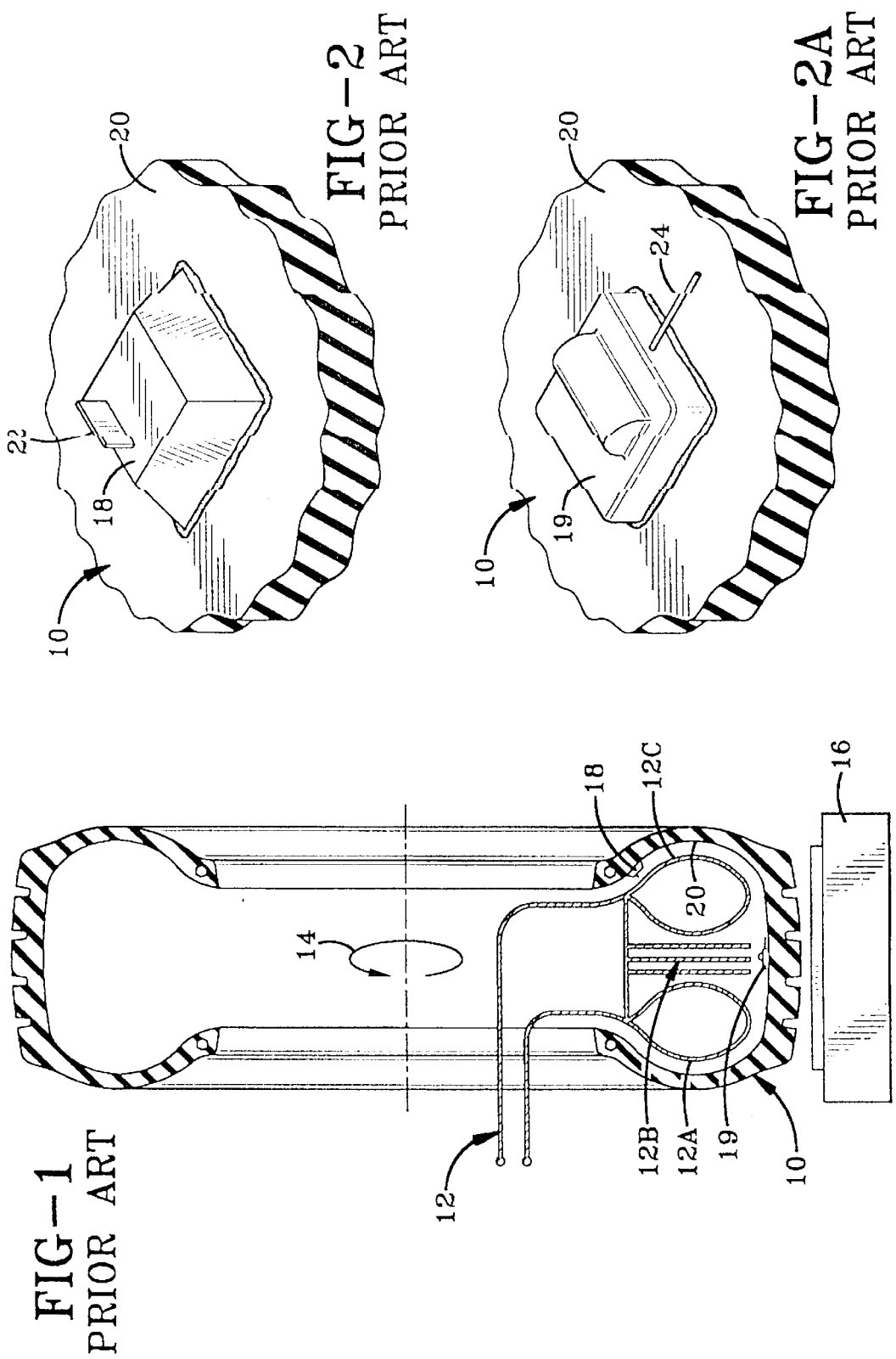

METHOD OF USING TIRE TAG PROTECTOR

BACKGROUND OF THE INVENTION

1. Technical Field

This invention relates generally to protective shields in the electrical art and, more particularly to a protective shield that is used to protect an electronic monitoring device or tire tag mounted on the inside of a pneumatic tire during a high-voltage, non-destructive test procedure. Specifically, the present invention relates to a protective device that is configured to be removably positioned over an electronic monitoring device in a pneumatic tire to protect the device from damage during a high-voltage, non-destructive test procedure.

2. Background Information

The treads of a pneumatic tire periodically wear out requiring the tire to be retreaded or replaced. Retreading tires for large trucks and vehicles is typically more economical than replacing a tire and is thus preferred in the art when the tire carcass is strong enough to be retreaded. The retreading process includes removing the worn tread package from the tire carcass and then attaching a new tread package to the carcass in a vulcanizing procedure. The retreading process results in a valuable tire as long as the carcass and new tread package are free of defects.

Tire carcasses must be tested for defects prior to retreading in order to avoid retreading a tire carcass having a defect that would immediately destroy the tire or cause the tire to fail shortly after retreading. One method of testing a tire carcass is subjecting the carcass to a high-voltage non-destructive test (hereinafter NDT) procedure. The NDT procedure includes the steps of mounting the tire carcass on a rotatable hub such that the carcass is disposed above a sensor plate. A fixed wire cage that substantially corresponds to the interior shape of the carcass is positioned inside the carcass above the sensor plate. The wire cage is energized with approximately 35,000 volts and the carcass is rotated through at least one full rotation. The rubber carcass functions to insulate the high-voltage wire cage from the sensor plate during the rotation. Any defect such as a puncture in the carcass allows the electricity to arc from the wire cage to the sensor plate. Any such arcs are sensed by the sensor plate and the defect allowing the arc is inspected to determine if it can be repaired or if the tire carcass must be scrapped. This procedure may also be performed on the carcass after it has been retreaded to check for defects.

A problem with this procedure arises when the tire carcass being tested has an electronic monitoring device (known in the art as a tire tag) mounted on the innerliner of the carcass. Two examples of such tire tags are shown in U.S. Pat. Nos. 3,787,806 and 5,500,065. A first problem is that the high-voltage test wire can snag on the tire tag and pull it from the innerliner. Another problem is that the electronic components of the tire tag are relatively sensitive and can be destroyed by the high voltage electrical environment of the NDT procedure. The components are damaged when electricity arcs between a test component and the monitoring device. The electric field created by the test components can also damage the monitoring device. A further problem is that the components of test equipment can be damaged if they snag on the tire tag. It is thus desired in the art to provide a protective device or shield that can be temporarily placed over the tire tag during the NDT procedure that shields the electronic components of the tire tag from damage and prevents the test equipment from snagging on the tire tag.

SUMMARY OF THE INVENTION

In view of the foregoing, it is an objective of the present invention to provide a tire tag protector that protects a tire tag during a high-voltage NDT procedure.

Another objective of the present invention is to provide a tire tag protector that can be temporarily attached to the innerliner over the tire tag and removed after the test procedure is completed.

A further objective of the present invention is to provide a tire tag protector that can be used with different types of tire tags.

A further objective of the present invention is to provide a tire tag protector that reduces the likelihood that the wire cage will snag on the protector and tear it loose from the tire.

Another objective of the present invention is to provide a tire tag protector that protects the tire tag even when the protector is in direct contact with the high-voltage test wire.

Another objective of the present invention is to provide a method of testing a tire for defects using a high-voltage non-destructive test procedure where the tire tag in a pneumatic tire is protected from the test equipment and the high-voltage test environment.

Another objective of the present invention is to provide a tire tag protector that is of simple construction, that achieves the stated objectives in a simple, effective, and inexpensive manner, and that solves the problems and that satisfies the needs existing in the art.

These and other objectives and advantages are obtained by a tire tag protector for shielding a tire tag during a high-voltage NDT procedure, the tire tag including a body configured to fit over the tire tag; the body defining a cup having a wall; and the wall being fabricated from a dielectric.

Other objectives and advantages of the present invention are achieved by the combination of a tire, a tire tag, and a tire tag protector where the tire has an inner surface; the tire tag being mounted on the inner surface of the tire; and the tire tag protector covering the tire tag, the tire tag protector having a wall fabricated from a dielectric.

Further objectives and advantages of the present invention are achieved by a method of testing a tire for defects using a high-voltage, non-destructive test procedure when the tire has a tire tag, the method including the steps of covering the tire tag with a tire tag protector; testing the tire by inserting an electrode into the interior of the tire, energizing the electrode, and rotating the tire; and removing the tire tag protector from the tire.

BRIEF DESCRIPTION OF THE DRAWINGS

The preferred embodiments of the invention, illustrative of the best modes in which applicants have contemplated applying the principles, are set forth in the following description and are shown in the drawings and are particularly and distinctly pointed out and set forth in the appended claims.

FIG. 1 is a sectional view of a typical prior art pneumatic tire showing two of the tire tag sensors mounted therein moving past a device for applying a voltage when undergoing an NDT inspection;

FIG. 2 is an enlarged fragmentary view showing an enlargement of a prior art tire tag mounted on the innerliner of the tire of FIG. 1;

FIG. 2A is an enlarged fragmentary view showing an enlargement of another prior art tire tag mounted on the innerliner of the tire of FIG. 1;

Similar numerals refer to similar parts throughout the drawings.

DESCRIPTION OF THE PREFERRED EMBODIMENTS

Figure 3:
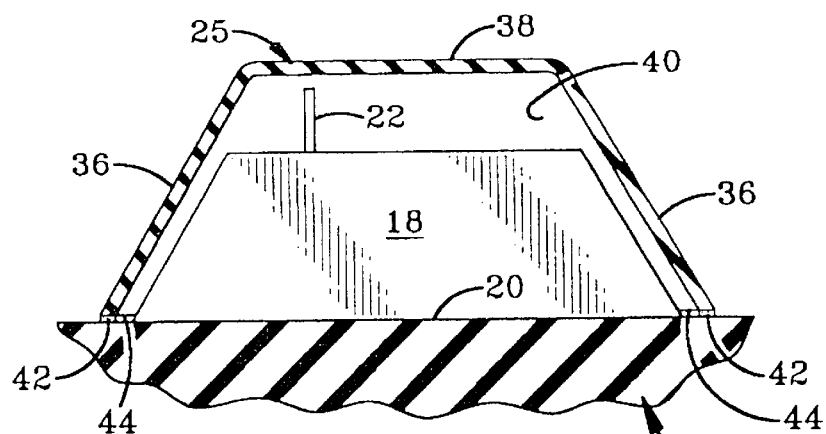
FIG. 3 is an enlarged sectional view showing the tire tag of FIG. 2 mounted within a first embodiment of the tire tag protector of the present invention.

An example of the equipment used to perform a high-voltage NDT procedure is depicted in FIG. 1. The NDT procedure is used to test for defects in a tire 10 by placing at least one electrode 12 inside tire 10. In some situations, multiple electrodes 12A, 12B and 12C may be provided to substantially conform to the inner shape of tire 10. In the embodiment of the test equipment depicted in FIG. 1, electrodes 12A and 12C are wire loops while electrode 12B is a plurality of dangling wires. Electrode 12 is energized with 35,000 volts of electricity and tire 10 is rotated as indicated by arrow 14 through at least one full rotation so that the entire tread circumference of tire 10 is subjected to the 35,000 volts. If any defects, such as nail holes or tears are present in tire 10, the electricity in electrode 12 will arc through tire 10 from electrode 12 to a sensor plate 16 where the arc is detected by usual NDT sensing equipment (not shown). This testing procedure is known in the art and performing this high voltage test on tires 10 having electronic monitoring devices or tire tags 18 mounted on the innerliner 20 of tire 10 creates problems.

The first problem is that electrode 12 snags on tire tags 18 and/or 19 and pulls them from the tire innerliner 20. Such snags may also damage electrode 12 by deforming the electrode or pulling it from the test unit. The tendency to snag is increased because tire tags 18 and 19 frequently have antennas 22 and 24 extending therefrom. Another problem with the NDT test procedure is that tire tags 18 and 19 contain sensitive electronic equipment that is easily damaged by the high-voltage test environment. The damage can be caused by arcing between electrode 12 and tire tag 18. Damage may also occur because tire tag 18 is exposed to the electric field created by electrode 12. Damaged tire tags 18 and 19 must be replaced causing the retreading cost to be increased and the amount of time required to perform the retread to be increased.

Figure 3A:
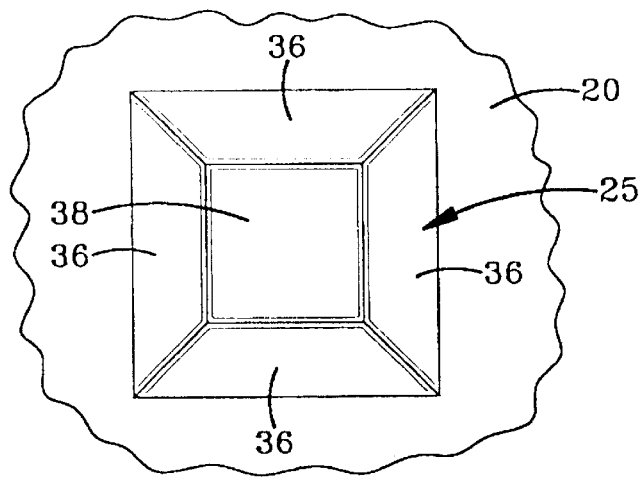
FIG. 3A is a top plan view of the first embodiment of the tire tag protector.

It is thus an objective of the present invention to provide a tire tag protector that can be temporarily positioned over tire tags 18 and 19 to prevent the tire tag from being damaged during the high-voltage NDT procedure. A first embodiment of the tire tag protector is indicated at 25 in FIGS. 3 and 3A and includes a cup-shaped body that is configured to fit over tire tag 18. The body of protector 25 includes a wall fabricated from a dielectric such as a rubber, thermoplastic elastomer, or thermoplastic urethanes. The dielectric wall prevents arcing between electrode 12 and tire tag 18 during the NDT procedure. The wall of protector 25 is formed in a shape to substantially match the shape of tire tag 18 and thus has four sloped sidewalls 36 that are joined by a substantially flat top 38. Sidewalls 36 and top 38 are configured to provide a space 40 above tire tag 18 to accommodate antenna 22.

Tire tag protector 25 is temporarily installed over tire tag 18 before the high-voltage NDT procedure is performed. One manner of installing protector 25 is by applying an adhesive 42 to lower edge 44 of protector 25 and placing protector 25 over tire tag 18. Any of a variety of suitable adhesives may be used to temporarily hold protector 25 on tire 10. One example is a hot melt adhesive. Protector 25 is pressed against innerliner 20 and adhesive 44 is allowed to set up to removably secure protector 25 to tire 10. The NDT procedure is then performed with the dielectric wall preventing the sensitive electronic components of tire tag 18 from being damaged by the electricity in electrode 12. The shape of walls 36 and 38 prevent electrode 12 from snagging on protector 25 and tearing it from tire 10. The dielectric prevents arcing between electrode 12 and tire tag 18.

Figure 4:
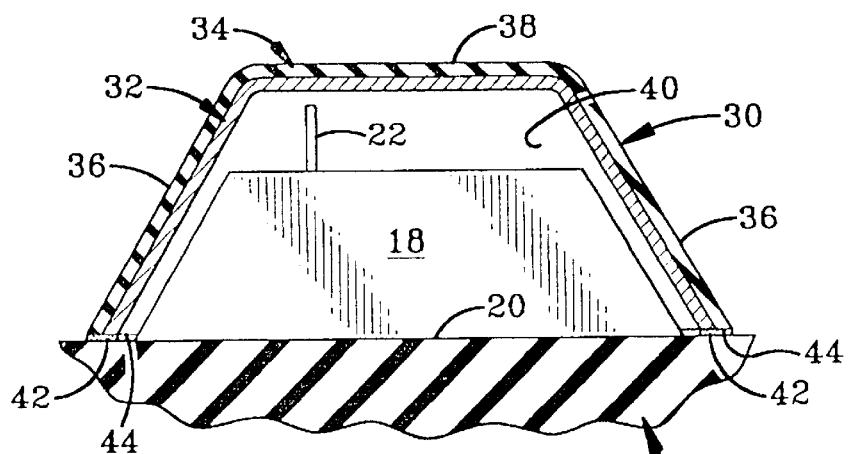
FIG. 4 is an enlarged sectional view showing the tire tag of FIG. 2 mounted within a second embodiment of the tire tag protector of the present invention.

The second embodiment of the tire tag protector is indicated at 30 in FIG. 4 and includes a cup-shaped body that is configured to fit over tire tag 18. The body of protector 30 includes a wall having an inner layer 32 and an outer layer 34. Inner layer 32 is fabricated from a conductive material such as copper, steel, aluminum, or the like. Outer layer 34 is fabricated from a dielectric such as a rubber, thermoplastic elastomer, or thermoplastic urethanes. Layers 32 and 34 are connected together with substantially no space between the layers.

Second embodiment of tire tag protector 30 is formed in a shape to substantially match the shape of tire tag 18 and thus has four sloped sidewalls 36 that are joined by the substantially flat top 38. Sidewalls 36 and top 38 are configured to provide the space 40 above tire tag 18 to accommodate antenna 22.

Tire tag protector 30 is temporarily installed over tire tag 18 before the high-voltage NDT procedure is performed. One manner of installing protector 30 is by applying the adhesive 42 to the lower edge 44 of protector 30 and placing protector 30 over tire tag 18. One example would be a hot melt adhesive. Protector 30 is pressed against innerliner 20 and adhesive 42 is allowed to set up to removably secure protector 30 to tire 10. The NDT procedure is then performed with layers 32 and 34 of protector 30 preventing the sensitive electronic components of tire tag 18 from being damaged by the electricity in electrode 12. The shape of walls 36 and 38 prevent electrode 12 from snagging on protector 30 and tearing it loose from tire tag 18. Dielectric layer 34 prevents arcing as described above with respect to the first embodiment. Conductive layer 32 forms a partial Faraday cage around tire tag 18 that protects tag 18 from the electric field formed by electrode 12.

Figure 5:
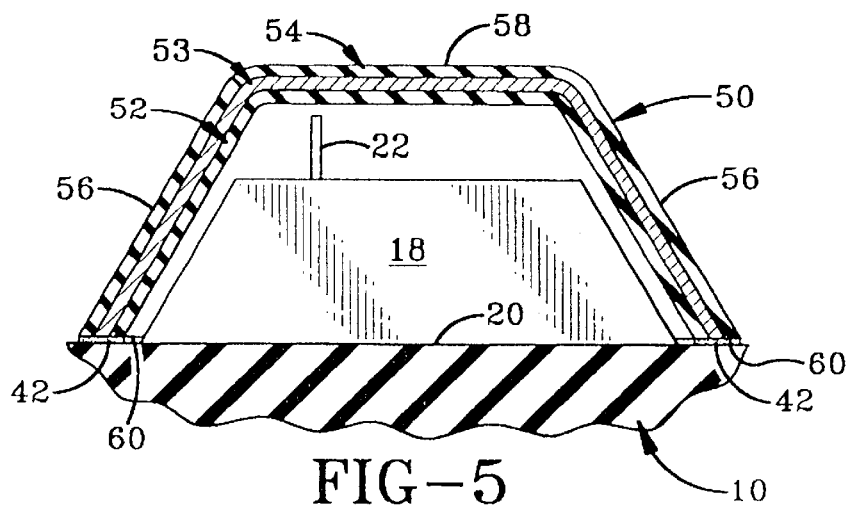
FIG. 5 is a view similar to FIGS. 3 and 4 showing a third embodiment of the tire tag protector surrounding the tire tag of FIG. 2.

A third embodiment of the tire tag protector is depicted in FIG. 5 and is generally indicated by the numeral 50. Tire tag protector 50 is substantially the same as tire tag protector 30 except that both inner layer 52 and outer layer 54 are fabricated from a dielectric. The wall also includes an intermediate layer 53 which is disposed between layers 52 and 54. Layer 53 is fabricated from a conductive material as described above. Tire tag protector 50 includes substantially the same sidewalls 56 and top wall 58 as tire tag protector 30. Tire tag protector 50 is also attached to innerliner 20 by applying adhesive 42 at the bottom surface 60 of tire tag protector 50. Inner layer 52 protects antenna 22 from damage if antenna 22 contacts protector 50 during the test procedure.

Figure 6:
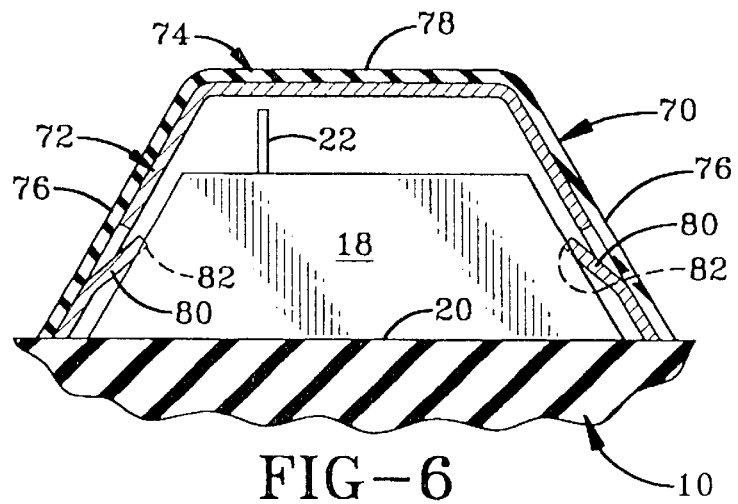
FIG. 6 is a view similar to FIGS. 3–5 of a fourth embodiment of the tire tag protector of the present invention.
Figure 6A:
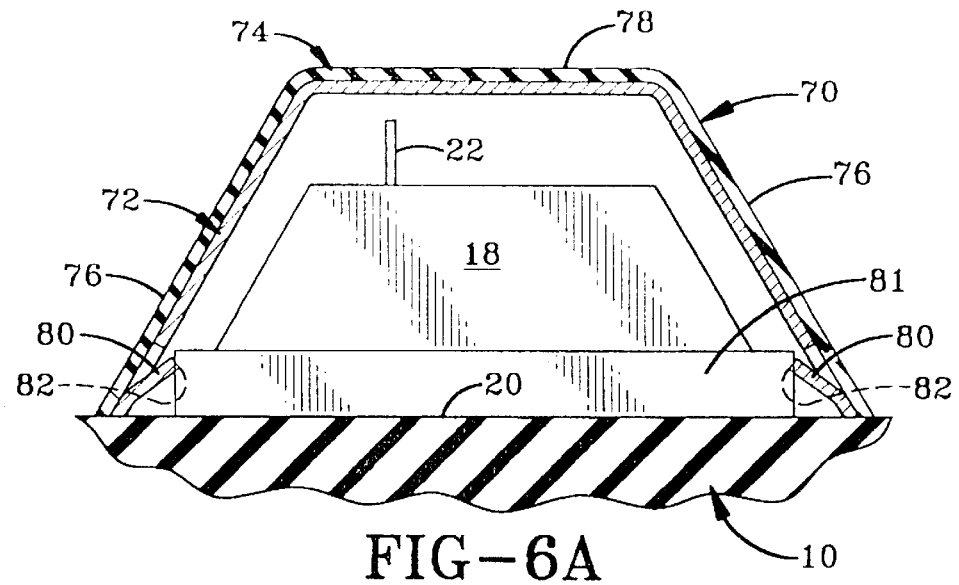
FIG. 6A is a view similar to FIG. 6 showing an alternative of the fourth embodiment.

A fourth embodiment of the tire tag protector of the present invention is depicted in FIG. 6 and is generally indicated by the numeral 70. Protector 70 also includes an inner layer 72 and an outer layer 74 as described above with respect to protectors 30 and 50. In protector 70 depicted in FIG. 6, inner layer 72 is formed from a conductive material with outer layer 74 being fabricated from the dielectric material. Protector 70 includes sidewalls 76 and a top wall 78 shaped similarly to the sidewalls and top walls discussed above with respect to protectors 30 and 50. Sidewalls 76 of protector 70 include prongs 80 that may be integrally formed in inner layer 72. Prongs 80 extend inwardly and are adapted to engage either tire tag 18 itself (FIG. 6) or a patch 81 (FIG. 6A) that connects tag 18 to innerliner 20. Prongs 80 hold protector 70 on tire tag 18 during the NDT procedure. Prongs 80 may include sharpened barbs 82 that press into the outer surface of tire tag 18 or patch 81. In the embodiments shown in FIGS. 6 and 6A, a covering step is preformed without adhesively connecting the tire tag protector to the tire tag.

Figure 7:
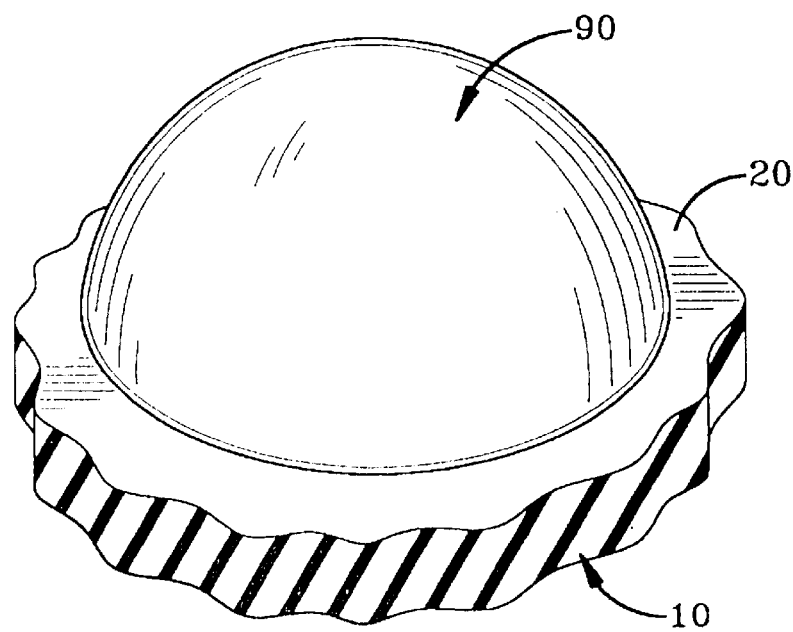
FIG. 7 is an enlarged perspective view of a fifth embodiment of the tire tag protector of the present invention.
Figure 8:
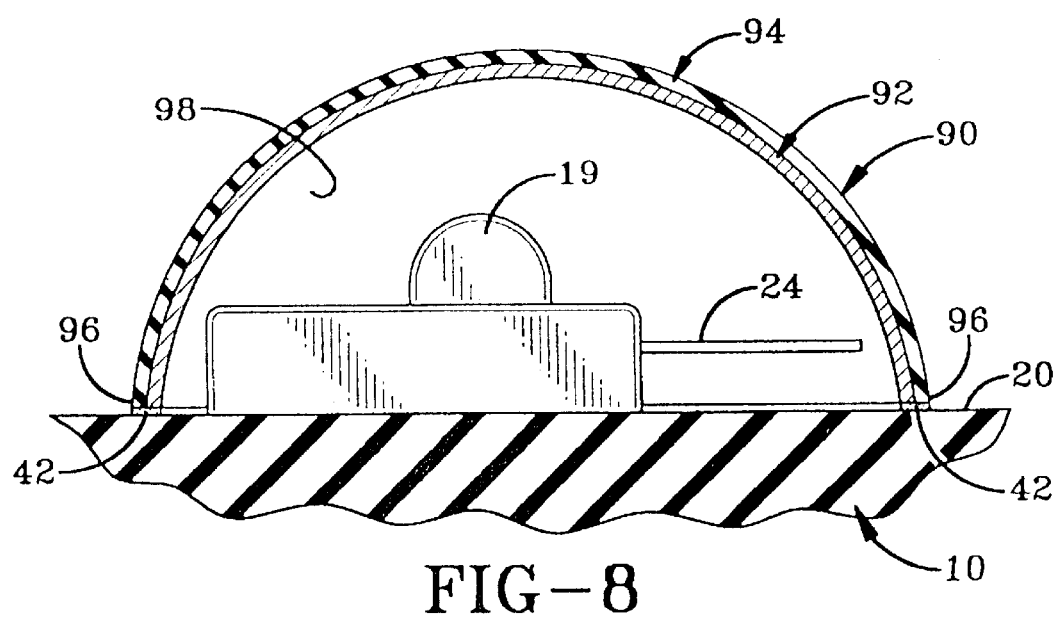
FIG. 8 is a sectional view similar to FIGS. 3–5 of the fifth embodiment of the tire tag protector of the present invention used with the tire tag of FIG. 2A.

A fifth embodiment of the tire tag protector of the present invention is generally indicated by the numeral 90 and is shown in FIGS. 7 and 8. The wall of protector 90 includes an inner layer 92 and an outer layer 94. Inner layer 92 is fabricated from a conductive material and outer layer 94 is fabricated from a dielectric such as rubber.

Tire tag protector 90 is shaped differently than protectors 30, 50 and 70 and is in the form of a rounded dome and may be partially spherical. Protector 90 includes a bottom surface 96 that is secured to innerliner 20 with adhesive 42 to removably hold protector 90 over tire tag 19 during the NDT procedure. Tire tag protector 90 has ample room inside layers 92 and 94 as indicated by numeral 98, so that it may be fit over a wide variety of tire tags 18 or 19.

Accordingly, the improved tire tag protector is simplified, provides an effective, safe, inexpensive, and efficient device which achieves all the enumerated objectives, provides for eliminating difficulties encountered with prior devices, and solves problems and obtains new results in the art.

In the foregoing description, certain terms have been used for brevity, clearness and understanding; but no unnecessary limitations are to be implied therefrom beyond the requirement of the prior art, because such terms are used for descriptive purposes and are intended to be broadly construed.

Moreover, the description and illustration of the invention is by way of example, and the scope of the invention is not limited to the exact details shown or described.

Having now described the features, discoveries and principles of the invention, the manner in which the improved tire tag protector is construed and used, the characteristics of the construction, and the advantageous, new and useful results obtained; the new and useful structures, devices, elements, arrangements, parts and combinations, are set forth in the appended claims.

We claim:

1. A method of testing a tire for defects using a high-voltage, non-destructive test procedure when the tire has a tire tag, the method comprising the steps of:

covering the tire tag with a tire tag protector having a wall formed at least partially of a dielectric; the tire tag protector adapted to protect the tire tag from the high voltage electrode during the test procedure so that the tire tag does not have to be removed during the test procedure;

the covering step being performed without adhesively connecting the tire tag protector to the tire tag;

testing the tire by inserting a high-voltage electrode into the interior of the tire, energizing the electrode, and rotating the tire; and removing the tire tag protector from the tire.

2. The method of claim 1 wherein the step of covering the tire tag with a tire tag protector includes the step of providing a tire tag protector having a layer of conductive material and a layer of dielectric.

3. The method of claim 1, further comprising the steps of providing a tire tag protector with inwardly projecting prongs and wherein the step of covering the tire tag with the tire tag protector includes the step of engaging the prongs with the tire tag.

4. A method of testing a tire for defects using a high-voltage, non-destructive test procedure when the tire has a tire tag, the method comprising the steps of:

providing a tire tag protector having a wall formed at least partially of a dielectric, the tire tag protector including at least a pair of inwardly-projecting prongs;

covering the tire tag with a tire tag protector; the step of covering the tire tag with the tire tag protector including the step of physically engaging the tire tag with the tire tag protectors;

the step of physically engaging the tire tag with the tire tag protector including the step of engaging the tire tag with the prongs of the tire tag protector;

testing the tire by inserting an electrode into the interior of the tire, energizing the electrode, and rotating the tire; and removing the tire tag protector from the tire.

5. A method of testing a tire for defects using a high-voltage, non-destructive test procedure when the tire has a tire tag, the method comprising the steps of:

providing a tire tag protector having a wall formed at least partially of a dielectric, the tire tag protector including at least a pair of inwardly-projecting prongs;

providing a patch that mounts the tire tag to the tire;

covering the tire tag and patch with a tire tag protector and engaging the prongs of the tire tag protector with the patch;

testing the tire by inserting an electrode into the interior of the tire, energizing the electrode, and rotating the tire; and removing the tire tag protector from the tire.

6. A method of testing a tire for defects using a high-voltage, non-destructive test procedure when the tire has a tire tag; the method comprising the steps of:

providing a tire tag protector having a curved outer surface that prevents an electrode from snagging on the tire tag protector; the tire tag protector having a dielectric layer;

covering the tire tag with the tire tag protector;

testing the tire by inserting the electrode into the interior of the tire, energizing the electrode, and rotating the tire; and removing the tire tag protector from the tire.

7. The method of claim 6, further comprising the step of providing the tire tag protector with a semi-spherical outer surface.

8. The method of claim 6, further comprising the step of connecting the tire tag protector to the tire with an adhesive.

* * * * *